US011766993B2

(12) United States Patent
Linden et al.

(10) Patent No.: US 11,766,993 B2
(45) Date of Patent: *Sep. 26, 2023

(54) AUTOMATIC POWER DOOR OPENING ON SUSTAINED PRESENCE

(71) Applicant: FORD GLOBAL TECHNOLOGIES, LLC, Dearborn, MI (US)

(72) Inventors: Howard Paul Tsvi Linden, Southfield, MI (US); John Robert Van Wiemeersch, Novi, MI (US); Onoyom Essien Ekanem, White Lake, MI (US); Laura Viviana Hazebrouck, Birmingham, MI (US); David Toppenberg, Ypsilanti, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 101 days.

This patent is subject to a terminal disclaimer.

(21) Appl. No.: 17/515,829

(22) Filed: Nov. 1, 2021

(65) Prior Publication Data

US 2022/0048466 A1 Feb. 17, 2022

Related U.S. Application Data

(63) Continuation of application No. 15/439,385, filed on Feb. 22, 2017, now Pat. No. 11,192,523.

(51) Int. Cl.
*B60R 25/01* (2013.01)
*E05B 81/76* (2014.01)
(Continued)

(52) U.S. Cl.
CPC .......... *B60R 25/01* (2013.01); *B60R 25/2045* (2013.01); *B60R 25/245* (2013.01);
(Continued)

(58) Field of Classification Search
None
See application file for complete search history.

(56) References Cited

U.S. PATENT DOCUMENTS

| 5,710,548 A | 1/1998 | LeMense |
| 6,583,715 B1 | 6/2003 | Benzie et al. |

(Continued)

FOREIGN PATENT DOCUMENTS

| CN | 103269914 A | 8/2013 |
| CN | 103670121 A | 3/2014 |

OTHER PUBLICATIONS

Notification of Second Office Action for CN Application No. 201810148810X dated Feb. 22, 2022.
(Continued)

*Primary Examiner* — Adolf Dsouza
(74) *Attorney, Agent, or Firm* — Vichit Chea; Carlson, Gaskey & Olds, P.C.

(57) ABSTRACT

A power door system for a vehicle including a plurality of power-operated doors is provided. The system includes a passive remote entry device configured to emit a signal to one or more cooperating vehicle receivers and a controller configured to cause the power door system to open the at least one power-operated door when the passive remote entry device signal is received and an individual is detected in a predefined activation zone for a predetermined period of time. The system further includes a vehicle-mounted user detection device. The passive remote entry device may be selected from the group consisting of a key fob, a smart key, a key card, a cellular telephone or smartphone configured with a phone-as-a-key function, a Bluetooth®-activated and vehicle-recognized cellular telephone, a Bluetooth®-activated and vehicle-recognized smartphone, and a Bluetooth®-activated and vehicle-recognized smartwatch.
(Continued)

Methods for controlling a power door system for a vehicle are described.

20 Claims, 3 Drawing Sheets

(51) Int. Cl.
*B60R 25/24* (2013.01)
*E05F 15/73* (2015.01)
*E05F 15/76* (2015.01)
*B60R 25/20* (2013.01)
*E05B 81/56* (2014.01)
*H03K 17/945* (2006.01)

(52) U.S. Cl.
CPC .............. *E05B 81/56* (2013.01); *E05B 81/77* (2013.01); *E05F 15/73* (2015.01); *E05F 15/76* (2015.01); *B60R 2325/101* (2013.01); *B60R 2325/205* (2013.01); *E05F 2015/763* (2015.01); *E05F 2015/767* (2015.01); *E05Y 2400/66* (2013.01); *E05Y 2400/852* (2013.01); *E05Y 2900/531* (2013.01); *H03K 17/945* (2013.01); *H03K 2217/94005* (2013.01)

(56) References Cited

U.S. PATENT DOCUMENTS

| | | | |
|---|---|---|---|
| 6,707,375 B2 | 3/2004 | Masudaya | |
| 8,319,605 B2 | 11/2012 | Hassan et al. | |
| 9,129,454 B2* | 9/2015 | Ghabra | B60R 25/00 |
| 9,493,125 B2* | 11/2016 | Heo | B60R 16/023 |
| 9,646,436 B1* | 5/2017 | Campbell | G07C 9/00309 |
| 2006/0049922 A1* | 3/2006 | Kolpasky | B60R 25/257 340/426.13 |
| 2013/0275008 A1 | 10/2013 | Breed | |
| 2015/0102898 A1 | 4/2015 | Tuennekens | |
| 2015/0120151 A1* | 4/2015 | Akay | B60R 25/01 701/1 |

OTHER PUBLICATIONS

Notification of Third Office Action for CN Application No. 201810148810X dated Jul. 27, 2022.

* cited by examiner

AUTOMATIC POWER DOOR OPENING ON SUSTAINED PRESENCE

CROSS-REFERENCE TO RELATED APPLICATION

This is a continuation of U.S. patent application Ser. No. 15/439,385, which was filed on Feb. 22, 2017.

TECHNICAL FIELD

This disclosure relates generally to vehicle power door systems. In particular, the disclosure relates to a power door system configured to open on detection of sustained presence of an individual desiring to gain entry to a vehicle equipped with the system.

BACKGROUND

Conventional remote entry devices for vehicles require some action on the part of the user, for example pressing a button or touching a sensor disposed on a vehicle door handle, to cause the door to unlock and in the case of a power door system, to automatically open. While it is known to provide a remote passive entry device to cause a vehicle power-operated door to unlock and automatically open, systems of this type typically are only designed to automatically unlock and open the driver's side front door.

However, passengers other than the driver may also desire the convenience of a door which automatically unlocks and opens. In turn, as autonomous vehicles become more prevalent, the requirement to automatically unlock/open the traditional driver's side front door may lessen since passengers are free to sit in any seat they desire.

There is also the issue that the door closest to the remote passive entry device may not be the only door desired to be automatically opened. For example, the driver carrying the remote passive entry device may want her door automatically opened, but likewise another occupant desiring to sit in a rear passenger seat may be carrying items to be placed in the vehicle, and may not have a hand free to operate a door mechanism. In yet another possible scenario, a driver may wish to secure a child/child seat in place in the vehicle rear seat before proceeding to the driver's seat, and may not have a hand free to operate the rear door mechanism.

To solve these and other problems, the present disclosure is directed to systems and methods for controlling a vehicle power-operated door system, predicated on a combination of an authorized remote passive entry device and on detected sustained presence of an individual in a predefined activation zone. The described systems and methods advantageously admit of automatically unlocking and opening any power door of a vehicle by a remote passive entry device, regardless of the position of an individual holding the device. Further, security measures are contemplated to prevent unauthorized entry to a vehicle equipped with the described systems, even if the proper remote passive entry device is disposed adjacent to the vehicle.

SUMMARY

In accordance with the purposes and benefits described herein, in one aspect of the present disclosure a control system for a vehicle including at least one power-operated door is provided, comprising a passive remote entry device configured to emit a signal to one or more cooperating vehicle receivers and a controller configured to cause the power door system to open the at least one power-operated door when the passive remote entry device signal is received and an individual is detected in a predefined activation zone for a predetermined period of time. The control system further includes at least one vehicle-mounted user detection system. The predetermined period of time may be from about 300 milliseconds to about 2 seconds and the predefined activation zone may be defined by an operative range of the at least one vehicle-mounted user detection system.

In embodiments, the at least one vehicle-mounted user detection system comprises devices selected from the group consisting of at least one vehicle-mounted proximity and/or presence sensor, at least one vehicle-mounted imager, at least one ultrasonic sensor-based gesture reading device, and combinations. In embodiments, the passive remote entry device is selected from the group consisting of a key fob, a smart key, a key card, a cellular telephone or smartphone configured with a phone-as-a-key function, a Bluetooth®-activated and vehicle-recognized cellular telephone, a Bluetooth®-activated and vehicle-recognized smartphone, and a Bluetooth®-activated and vehicle-recognized smartwatch.

In embodiments, the controller is configured to cause the power door system to open all of the power-operated doors, to open only the power-operated doors located on a side of the vehicle nearest the passive remote entry device, to open only the power-operated door nearest the passive remote entry device, to open any power-operated door adjacent to a detected individual, or combinations thereof.

The controller may be further configured to authenticate one or more individuals attempting to gain entry to the vehicle. This may be by one or more of a determination of an authorized passive remote entry device, an image analysis and a gesture analysis. In embodiments, the authentication may be by one or more of a determination of an authorized passive remote entry device identification code, a determination of a predefined gesture pattern provided by the one or more individuals attempting to gain entry to the vehicle, an facial recognition analysis of one or more images taken of the one or more individuals attempting to gain entry to the vehicle, a gait analysis of one or more images taken of the one or more individuals attempting to gain entry to the vehicle, or a clothing analysis of one or more images taken of the one or more individuals attempting to gain entry to the vehicle.

In another aspect, a method for controlling a vehicle power door system is provided, comprising providing a passive remote entry device capable of emitting a signal to one or more cooperating vehicle receivers and providing a controller configured to cause the power door system to open the at least one power-operated door when the passive remote entry device signal is received and an individual is detected in a predefined activation zone for a predetermined period of time. The method further includes providing at least one vehicle-mounted user detection system. In embodiments, the method includes configuring the controller to cause the vehicle power door system to open the one or more of the plurality of power-operated doors if the individual is detected in the predefined activation zone for from about 300 milliseconds to about 2 seconds. The method further may include defining the predefined activation zone as an operative range of the at least one vehicle-mounted user detection system.

In embodiments, the method includes providing the at least one vehicle-mounted user detection system comprising devices selected from the group consisting of at least one vehicle-mounted proximity and/or presence sensor, at least one vehicle-mounted imager, at least one ultrasonic sensor-based gesture reading device, and combinations. In embodiments, the method includes selecting the passive remote entry device from the group consisting of a key fob, a smart key, a key card, a cellular telephone or smartphone configured with a phone-as-a-key function, a Bluetooth®-activated and vehicle-recognized cellular telephone, a Bluetooth®-activated and vehicle-recognized smartphone, and a Bluetooth®-activated and vehicle-recognized smartwatch.

In embodiments, the method includes configuring the controller to cause the power door system to open all of the power-operated doors, to open only the power-operated doors located on a side of the vehicle nearest the passive remote entry device, to open only the power-operated door nearest the passive remote entry device, to open any power-operated door adjacent to a detected individual, or combinations thereof.

The method may further include configuring the controller to authenticate one or more individuals attempting to gain entry to the vehicle. This can include steps of configuring the controller to authenticate the one or more individuals attempting to gain entry to the vehicle by one or more of a determination of an authorized passive remote entry device, an image analysis and a gesture analysis. In embodiments, this may include further configuring the controller to authenticate the one or more individuals attempting to gain entry to the vehicle by one or more of a determination of an authorized passive remote entry device identification code, a determination of a predefined gesture pattern provided by the one or more individuals attempting to gain entry to the vehicle, an facial recognition analysis of one or more images taken of the one or more individuals attempting to gain entry to the vehicle, a gait analysis of one or more images taken of the one or more individuals attempting to gain entry to the vehicle, or a clothing analysis of one or more images taken of the one or more individuals attempting to gain entry to the vehicle.

In the following description, there are shown and described embodiments of the disclosed systems and methods for controlling a vehicle power door system. As it should be realized, the devices are capable of other, different embodiments and their several details are capable of modification in various, obvious aspects all without departing from the devices and methods as set forth and described in the following claims. Accordingly, the drawings and descriptions should be regarded as illustrative in nature and not as restrictive.

BRIEF DESCRIPTION OF THE DRAWINGS

The accompanying drawing figures incorporated herein and forming a part of the specification, illustrate several aspects of the disclosed systems and methods for controlling a vehicle power-operated door, and together with the description serve to explain certain principles thereof. In the drawings.

Figure 1:
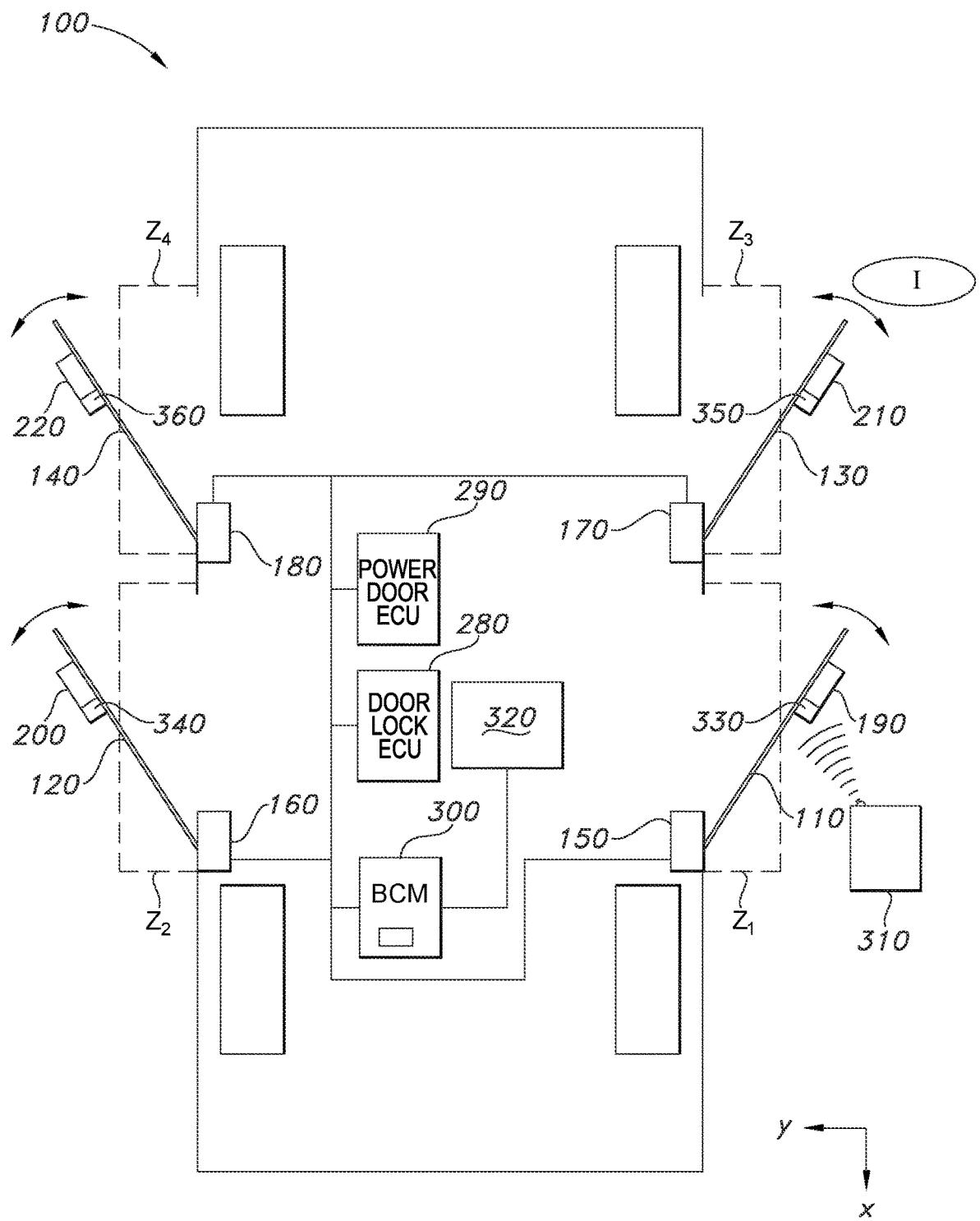
FIG. 1 illustrates a control system for a power-operated door system for a vehicle according to the present disclosure.

Reference will now be made in detail to embodiments of the disclosed systems and methods for controlling a vehicle power door system, examples of which are illustrated in the accompanying drawing figures. The figures are not necessarily to scale and some features may be exaggerated or minimized to show details of particular components. The specific structural and functional details disclosed are not to be interpreted as limiting, but as a representative basis for teaching one skilled in the art how to practice the disclosed concepts.

DETAILED DESCRIPTION

The present document describes various embodiments of systems and methods for controlling a power door system comprising one or more power-operated doors. Preliminarily, the document describes such power door systems in the context of vehicle power-operated hinged front and rear side doors which open and close about a generally vertical hinged axis. However, the skilled artisan will readily appreciate that the systems and methods are equally applicable to other types of vehicle power-operated doors, for example rear hinged hatchback closures and liftgates, sliding side doors such as are often found in vans, panel trucks, and minivans, sunroofs/moonroofs, truck tailgates, and others. Accordingly, the descriptions herein will not be taken as limiting in this regard.

The specific mechanisms for operating such power door systems are known and do not require extensive description herein. However, with reference to FIG. 1 as is known a power door system for a vehicle 100 at a high level comprises one or more vehicle power-operated doors 110, 120, 130, 140 each fitted with a power lock/unlock system, a power release system, and a power open/close mechanism (depicted generally as power-operated door mechanisms 150, 160, 170, 180) for automatically opening a vehicle door on receipt of an appropriate signal. The power open/close mechanism may be an actuator such as a motor, a linear actuator, or a hydraulic mechanism operatively connected to an actuator arm such as a screw and/or check arm, or combinations thereof. Non-limiting examples of such power-operated door systems are disclosed in U.S. Pat. No. 7,500,711 and in U.S. Published Patent Appl. No. 2015/0283886, owned by the present Assignee Ford Global Technologies, LLC and incorporated herein in their entirety by reference.

Receivers 190, 200, 210, 220 may be provided, in the depicted embodiment being disposed respectively on power-operated doors 110, 120, 130, 140 and adapted for receiving a lock/unlock and/or open/close signal from a suitable device. The power-operated door mechanisms 150, 160, 170, 180 and receivers 190, 200, 210, 220 are operatively connected to one or more vehicle controllers. In the depicted embodiment, the power-operated door mechanisms 150, 160, 170, 180 and receivers 190, 200, 210, 220 are operatively connected to various vehicle electronic control units (ECU) including a door lock ECU 280, a power-operated door ECU 290, and the vehicle body control module (BCM) 300. However, other configurations are known and are contemplated for use herein.

The lock/unlock and/or open/close signal may be provided by an active entry device such as a key or keypad (not shown), or by an active remote entry device (not shown) such as a key fob requiring user action such as pushing a button. It is also known to actuate power-operated doors by a passive remote entry device 310 as shown in the drawing, i.e. a device which emits a signal to a cooperating receiver 190, 200, 210, 220 associated with one or more power-operated doors 110, 120, 130, 140 to cause the power-operated door to open without other user intervention. Various types of passive remote entry devices 310 are known in the art, including without intending any limitation key fobs, smart keys, key cards, cellular telephones or smartphones configured with a phone-as-a-key function, Bluetooth®-activated and vehicle-recognized devices including cellular telephones, smartphones, wrist-worn devices such as "smartwatches," and others. Such programming can be provided in firmware, in software, as downloadable apps, etc.

On receipt of the appropriate signal, the power-operated door mechanism 150 unlocks, unlatches, and automatically opens the power-operated door 110, requiring only the physical presence of the passive remote entry device 310 within a predetermined operating range distance from the cooperating receiver 190, 200, 210, 220, without otherwise requiring any physical action from a user. As described above, however, such systems are typically associated only with a driver's side front power-operated door 110.

To address this problem, the present disclosure further relates to systems and methods for controlling a power door system as described above, further including devices and methods for allowing automated opening of any or all of the power-operated doors 110, 120, 130, 140 as needed. In furtherance of this purpose, devices and methods are provided allowing detection and optionally authentication of an individual I positioned in a predefined activation zone Z, i.e. a predefined area in front of a power-operated door 110, 120, 130, or 140 to which she desires entry.

In more detail, the vehicle 100 further includes a suitable user detection system shown generally as reference numeral 320. The user detection system 320 is configured to detect the passive remote entry device 310 and/or the individual I, and the predefined activation zone(s) Z may be defined by a useful operating range of the user detection system 320. Multiple useful operating ranges of the user detection system 320 are possible and contemplated according to the technology implemented. In one embodiment, the user detection system 320 may include suitable proximity and/or presence sensors 330, 340, 350, 360 positioned in appropriate locations appropriate for detecting a passive remote entry device 310 and/or an individual I positioned in a predetermined activation zone Z.

Suitable proximity and/or presence sensors 330, 340, 350, 360 include without intending any limitation radiofrequency (RF) and Bluetooth® sensors, the specific design and function of which are well known to the skilled artisan. These sensors 330, 340, 350, 360 may be disposed in any suitable location, for example on an exterior vehicle 100 surface, associated with a door handle (not shown) of power-operated doors 110, 120, 130, 140, under applique (such sensors are capable of detecting proximity/presence through materials such as thermoplastics) associated with power-operated doors 110, 120, 130, 140, or other vehicle 100 features. In embodiments, the proximity and/or presence sensors 330, 340, 350, 360 may detect/recognize authorized passive remote entry devices 310 at a predetermined detection/recognition distance, for example 20 meters. However, no action is taken until the authorized passive remote entry device 310 is determined to be positioned at a predetermined operative distance from a proximity and/or presence sensors 330, 340, 350, 360 for a predetermined period of time as is described below. In one possible embodiment, the predetermined operative distance is 800 mm.

The user detection system 320 may alternatively or in addition include a suitable imager such as a 360 degree camera system disposed on or in the vehicle 100, or may comprise multiple imagers each positioned adjacent a power-operated door 110, 120, 130, 140 to capture images of a corresponding predefined activation zone Z.

In yet another embodiment, the user detection system 320 may alternatively or in addition include a suitable ultrasonic sensor-based gesture reading device operatively linked to a controller as described above, the controller being configured to analyze a gesture or sequence of gestures and, on determining the correct gesture(s), authenticate the individual I seeking entrance to the vehicle 100. The operation of such ultrasonic sensor-based gesture reading devices is known in the art, and does not require extensive discussion herein. However, at a high level such devices provide gesture-based touchless interfaces that can detect the position of a user's hand in a space located at a predetermined distance from the sensing device. The interface may be based on ultrasonic emitters that can detect the position of the user's hand by analyzing the acoustic wave reflected by the hand. The distance may be computed by using the standard principle of triangulation. Such devices are capable of detecting and identifying various gestures such as waving gestures, and the movement of the hand towards or away from the ultrasound receivers.

Figure 2:
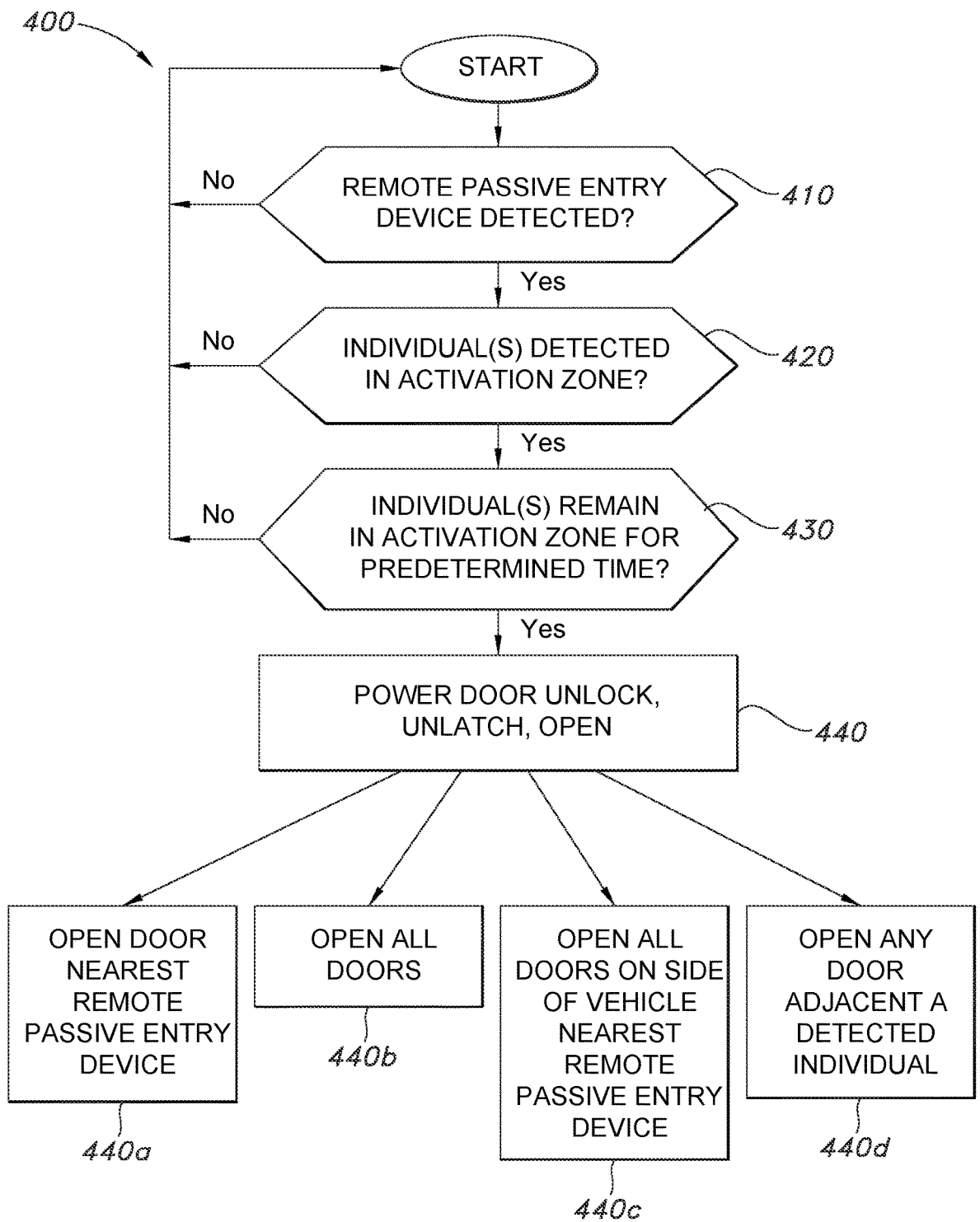
FIG. 2 depicts in flow chart form an embodiment of a method for controlling the power-operated door system of FIG. 1.

FIG. 2 describes an embodiment of a method 400 for controlling a power door system such as is illustrated in FIG. 1. According to this embodiment, at step 410 the presence of a remote passive entry device 310 is detected, such as by a signal emitted to receivers 190, 200, 210, 220 and/or to proximity and/or presence sensors 330, 340, 350, 360. As is known, such signals may be provided by a variety of technologies, including without intending any limitation radiowaves, wi-fi, Bluetooth®, and others. Concurrently or sequentially, at step 420 the presence of one or more individuals I in one or more predefined activation zones Z of the vehicle 100 is determined by user detection system 320. In an embodiment, the activation zones Z of the vehicle 100 are defined by the predetermined operative distance or range of the proximity and/or presence sensors 330, 340, 350, 360.

This detection of an individual I in one or more predefined activation zones Z may be accomplished by a variety of devices. For example, as described above the user detection system 320 may comprise suitable proximity/presence sensors 330, 340, 350, 360 positioned in appropriate locations such as an exterior portion of the power-operated doors 110-140. An individual I positioned in front of one of the power-operated doors will be detected by the appropriate proximity/presence sensor 330-360. Such proximity/presence sensors 330-360 are known in the art, being already provided for uses such as detecting other vehicles traveling in a side view mirror blind spot, etc.

Alternatively or additionally, the user detection system 320 may comprise one or more suitable imagers configured to capture and provide images of the predefined activation zones Z, and of individuals I standing therein, and transmit those images to a vehicle controller such as an ECU or BCM 300. One suitable imager such as a 360 degree camera may be provided. As another possible embodiment, multiple imagers may be provided with each respectively disposed before a predefined activation zone Z for a power-operated door 110-140. Use of still imagers, video imagers, etc. is contemplated. Such imagers are known in the art, being already provided for uses such as rear camera systems actuated on placing a vehicle 100 in reverse to provide a view of items or persons which may be behind the vehicle, etc.

To prevent the risk of a power-operated door 110, 120, 130, 140 opening in response to the presence of a casual passer-by, the method further contemplates at step 430 that the presence of one or more individuals I in one or more predefined activations zones $Z_1$, $Z_2$, $Z_3$, $Z_4$ must be detected for a predetermined period of time. This predetermined period of time is selected to be indicative of an individual I pausing before a power-operated door 110, 120, 130, or 140 through which she wishes to enter the vehicle 100 and unlikely to be simply a pedestrian passing by the vehicle. In one embodiment, an individual I standing in a predefined activation zone $Z_1$, $Z_2$, $Z_3$, or $Z_4$ of a particular power-operated door 110-140 for from about 300 milliseconds to about 2 seconds will be interpreted by the system as an individual desiring entry into the vehicle 100 by that particular power-operated door. In another possible embodiment, an individual I standing in a predefined activation zone $Z_1$, $Z_2$, $Z_3$, or $Z_4$ of a particular power-operated door 110-140 for about 300 milliseconds will be interpreted by the system as an individual desiring entry into the vehicle 100 by that particular power-operated door. However, other time frames are contemplated. This can be accomplished by a timer associated with a vehicle controller such as an ECU, BCM 300, or others.

The vehicle 100 controller, for example the BCM 300, may be configured to take a number of actions on satisfaction of the conditions of steps 410-430. For example, the BCM 300 may cause the appropriate power-operated door mechanism 150, 160, 170, or 180 to unlock, unlatch, and open only the power-operated door 110, 120, 130, or 140 nearest to the remote passive entry device 310 (step 440*a*). Alternatively, the BCM 300 may cause the power-operated door mechanisms 150-180 to unlock, unlatch, and open all power-operated doors 110-140 on satisfaction of the conditions of steps 410-430.

As yet another embodiment, all power-operated doors on a side of the vehicle 100 nearest to the remote passive entry device 310 may open on satisfaction of the conditions, but only those doors. So, if the holder of the remote passive entry device 310 is standing near the driver's side front power-operated door 110, the BCM 300 may cause the power-operated door mechanisms 150 and 170 to unlock, unlatch, and open power-operated doors 110 and 130. In yet another possible embodiment, the BCM 300 may cause the appropriate power-operated door mechanisms 150-180 to unlock, unlatch, and open any corresponding power-operated door 110-140 having an individual I detected in the appropriate predefined activation zone $Z_1$, $Z_2$, $Z_3$, or $Z_4$ by the user detection system 320 for the predefined period of time required by step 430. So, if for example the holder of the remote passive entry device 310 is standing in the predefined activation zone $Z_1$ near the driver's side front power-operated door 110 but passengers are detected by the user detection system 320 on the passenger's side of the vehicle 100 and in the appropriate predefined activation zones $Z_2$ and $Z_4$ for the predetermined time periods, the BCM 300 may cause the power-operated door mechanisms 150, 160, and 180 to unlock, unlatch, and open power-operated doors 110, 120, and 140.

Figure 3:
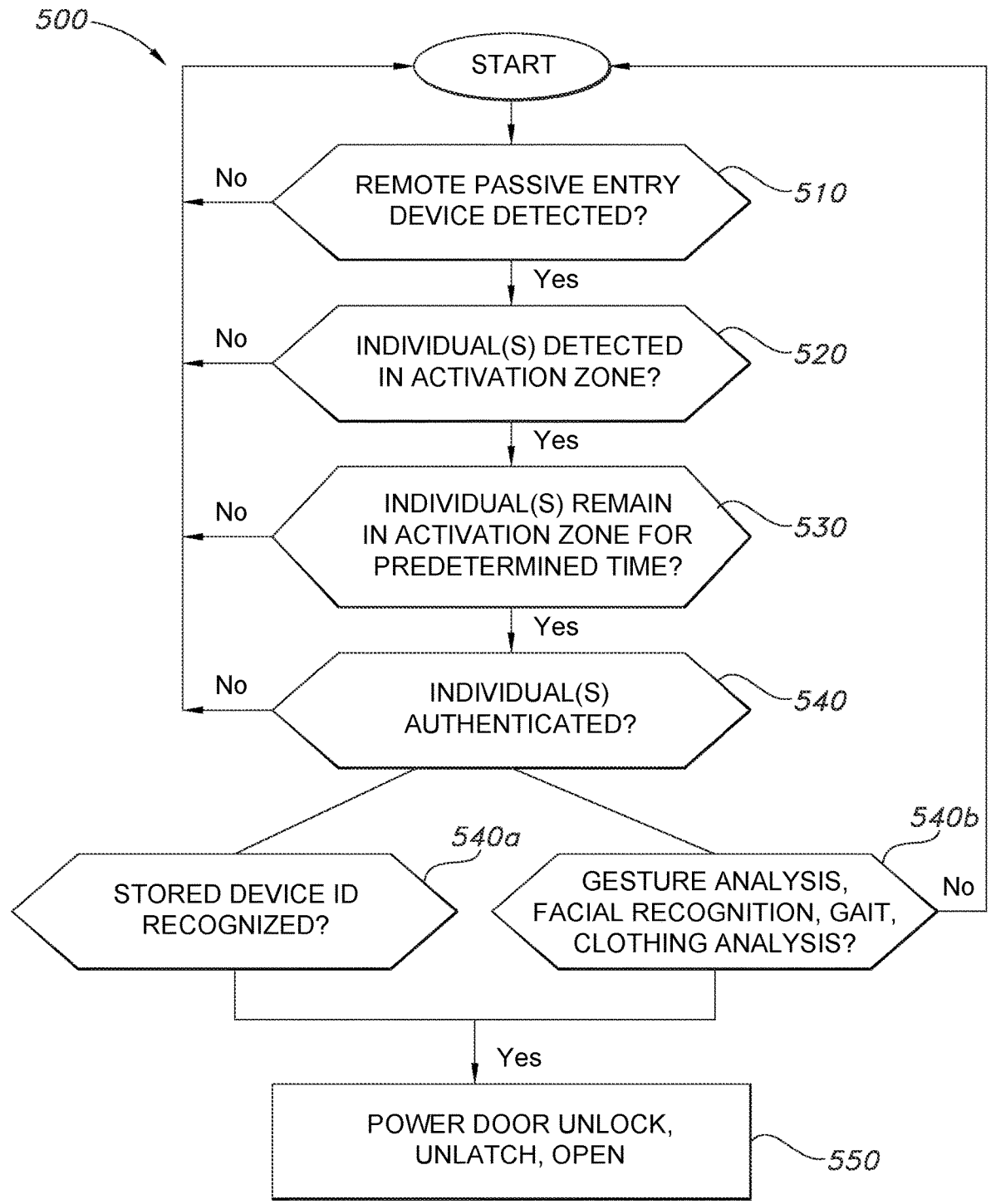
FIG. 3 depicts in flow chart form an embodiment of a method for controlling the power-operated door system of FIG. 1, including a visual authentication component.

It is further contemplated to incorporate additional safety features to prevent unauthorized individuals/strangers from gaining access to the vehicle 100. In certain embodiments, authentication procedures are contemplated. This is illustrated in FIG. 3, showing a method 500 for controlling a power door system. The methods proceed substantially as described above in the discussion of FIG. 2, including detecting a remote passive entry device 310 (step 510), detecting an individual I in a predefined activation zone $Z_1$, $Z_2$, $Z_3$, $Z_4$ (step 520), and verifying that the individual I has remained in the predefined activation zone for a predetermined period of time (step 530). At step 540, an authentication step is contemplated.

In one embodiment (step 540*a*), this could be verification of a stored device identification code, for example the Bluetooth® or wi-fi code for a passenger's smartphone stored in memory by the BCM 300 or other ECU. These codes could be specifically entered and stored using procedures similar to those currently utilized for synchronizing a smartphone with a vehicle 100 controller to allow hands-free calls. Alternatively, the codes may be automatically queried for and stored in memory by BCM 300 or other ECU as passengers enter/exit the vehicle 100.

In another embodiment (step 540*b*), a visual authentication procedure is contemplated. Various suitable procedures are contemplated. One possible embodiment contemplates use of the user detection system 320 comprising a suitable ultrasonic sensor-based gesture reading device as described above, the ultrasonic sensor-based gesture reading device being operatively linked to a controller configured to analyze a gesture or sequence of gestures and, on determining that the individual has provided the correct gesture or sequence of gestures, to authenticate the individual I seeking entrance to the vehicle 100.

Another possible embodiment contemplates use of the user detection system 320 comprising a suitable imager as described above. In use, the imager captures baseline still or moving images of an individual I during the process as described for steps 510-530, and/or as an individual I exits the vehicle 100. The baseline images captured as the individual I enters the vehicle 100 are stored in memory by BCM 300 or other ECU. Then, images captured by the user identification system 320 as the individual attempts to re-enter the vehicle 100 may be compared to the baseline images for authentication purposes. A number of suitable authentication techniques relying on image analysis are known in the art, including without intending any limitation facial recognition, gait analysis, clothing analysis, and others. Use of any such authentication techniques, or combinations of techniques, is contemplated.

Once the individual I has been successfully authenticated, at step 550 the appropriate power-operated doors 110-140 are opened as described above.

Obvious modifications and variations are possible in light of the above teachings. All such modifications and variations are within the scope of the appended claims when interpreted in accordance with the breadth to which they are fairly, legally and equitably entitled.

What is claimed:
1. A vehicle power door system, comprising:
a plurality of power operated doors; and
a controller configured to initiate an automated power-operated door opening sequence of at least one of the plurality of power operated doors when an authorized individual is detected in an activation zone of the vehicle and the authorized individual has remained in the activation zone for a predetermined period of time,
wherein the automated power-operated door opening sequence includes at least one of opening only a power operated door of the plurality of power operated doors that is located nearest to the authorized individual or opening each power-operated door of the plurality of power operated doors that is located on a side of the vehicle nearest to the authorized individual.
2. The system as recited in claim 1, comprising a vehicle-mounted user detection system.

3. The system as recited in claim 2, wherein the vehicle-mounted user detection system includes a proximity and/or presence sensor, an imager, an ultrasonic sensor-based gesture reading device, or combinations thereof.

4. The system as recited in claim 1, wherein the controller is configured to detect when the authorized individual is located in the activation zone in response to receiving a signal from a passive remote entry device.

5. The system as recited in claim 4, wherein the passive remote entry device is a key fob, a smart key, a key card, a cellular telephone or smartphone configured with a phone-as-a-key function, a Bluetooth®-activated and vehicle-recognized cellular telephone, a Bluetooth®-activated and vehicle-recognized smartphone, or a Bluetooth®-activated and vehicle-recognized smartwatch.

6. The system as recited in claim 1, wherein the predetermined period of time is between about 300 milliseconds and about 2 seconds.

7. The system as recited in claim 1, wherein the activation zone is defined by an operative range established by at least one vehicle-mounted user detection system.

8. The system as recited in claim 1, wherein the controller is further configured to cause the vehicle power door system to open all of the plurality of power operated doors.

9. The system as recited in claim 1, wherein the controller is further configured to authenticate one or more additional individuals attempting to gain entry to the vehicle.

10. The system as recited in claim 9, wherein the automated power-operated door opening sequence includes opening any power operated door of the plurality of power operated doors that is adjacent to the authenticated one or more additional individuals.

11. A vehicle power door system, comprising:
a plurality of power operated doors; and
a controller configured to initiate an automated power-operated door opening sequence of at least one of the plurality of power operated doors when an authorized individual is detected in an activation zone of the vehicle, the authorized individual has remained in the activation zone for a predetermined period of time, and a predefined gesture pattern has been received from the authorized individual,
wherein the automated power-operated door opening sequence includes opening one or more power operated doors of the plurality of power operated doors that are indicated by the predefined gesture pattern.

12. The system as recited in claim 11, comprising a vehicle-mounted user detection system configured to detect the predefined gesture pattern.

13. The system as recited in claim 12, wherein the controller is configured to analyze the predefined gesture pattern to determine whether or not to initiate the automated power-operated door opening sequence.

14. The system as recited in claim 12, wherein the vehicle-mounted user detection system includes an ultrasonic sensor-based gesture reading device operatively linked to the controller.

15. The system as recited in claim 11, wherein the controller is configured to detect when the authorized individual is located in the activation zone in response to receiving a signal from a passive remote entry device.

16. The system as recited in claim 11, wherein the predetermined period of time is between about 300 milliseconds and about 2 seconds.

17. The system as recited in claim 11, wherein the controller is further configured to authenticate one or more additional individuals attempting to gain entry to the vehicle.

18. The system as recited in claim 17, wherein the automated power-operated door opening sequence includes opening any power operated door of the plurality of power operated doors that is adjacent to the authenticated one or more additional individuals.

19. The system as recited in claim 11, wherein each of the plurality of power operated doors includes a power lock/unlock system, a power release system, and a power open/close mechanism.

20. A method, comprising:
detecting whether an authorized individual is located in an activation zone of a vehicle equipped with a power door system;
determining whether the authorized individual has remained in the activation zone for a predetermined period of time; and
initiating an automated power-operated door opening sequence of the power door system when the authorized individual is located in the activation zone and has remained in the activation zone for the predetermined period of time,
wherein the automated power-operated door opening sequence includes at least one of opening only a power-operated door of the power door system that is located nearest to the authorized individual or opening each power-operated door of the power door system that is located on a side of the vehicle nearest to the authorized individual.

* * * * *